(12) United States Patent
Lin et al.

(10) Patent No.: US 10,750,262 B2
(45) Date of Patent: Aug. 18, 2020

(54) DISPLAY DEVICE

(71) Applicant: QISDA CORPORATION, Taoyuan (TW)

(72) Inventors: Chih-Hung Lin, Taoyuan (TW); Hsun-Cheng Cho, New Taipei (TW); Long-Sing Jhong, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/368,884

(22) Filed: Mar. 29, 2019

(65) Prior Publication Data
US 2019/0349657 A1 Nov. 14, 2019

(30) Foreign Application Priority Data

May 10, 2018 (CN) .......................... 2018 1 0445017

(51) Int. Cl.
*H04R 1/02* (2006.01)
*H05K 5/00* (2006.01)
*H05K 5/03* (2006.01)

(52) U.S. Cl.
CPC ........... *H04R 1/025* (2013.01); *H05K 5/0017* (2013.01); *H05K 5/03* (2013.01); *H04R 2499/15* (2013.01)

(58) Field of Classification Search
CPC ........ H04R 5/02; H04R 2499/15; H04R 1/26; H04R 1/2857; H04R 1/2819; H04R 1/2888; H04R 1/345; H04R 1/021; H04R 1/22; H04R 1/2826; H04R 1/288; H04R 1/2896; H04R 2400/03; H04R 2499/11; H04R 7/04; H04R 7/045; H04R 7/127; H04R 9/025; H04R 9/045; H04R 9/063; H04R 1/02; H04R 1/025; H04R 1/028; H04R 1/1008; H04R 1/1075; H04R 1/2811; H04R 1/30; H04R 1/34; H04R 1/406; H04R 2205/021; H04R 2205/022; H04R 2227/003; H04R 2227/005; H04R 2410/00; H04R 2430/23; H04R 27/00; H04R 3/005; H04R 5/033; H04R 5/04; H04N 5/64; H04N 5/642; H04N 5/66; H04N 13/341; H04N 13/398; H04N 2213/001; H04N 2213/008; H04S 2420/01; H04S 7/00; G10L 15/28; G10L 15/22
(Continued)

(56) References Cited

U.S. PATENT DOCUMENTS 5,588,063 A * 12/1996 Edgar .................. G06F 1/1605
381/182
7,280,665 B2 * 10/2007 Tamura .................. H04N 5/642
348/E5.13
(Continued)

FOREIGN PATENT DOCUMENTS

CN       103299654 A       9/2013

*Primary Examiner* — Lun-See Lao

(57) ABSTRACT

A display device includes a casing, a display module and a woofer. The casing includes a back cover. A top side of the back cover has a plurality of sound holes formed thereon. A wall structure extends from an inner surface of the back cover. An opening of the back cover communicates with the sound holes. The display module is disposed in the casing. The woofer is disposed in the casing and located between the display module and the back cover. The wall structure encloses the woofer to guide a sound outputted by the woofer to the sound holes through the opening.

5 Claims, 8 Drawing Sheets

(58) Field of Classification Search
USPC ....... 381/333, 335, 332, 337, 388, 386, 336; 181/148, 156, 198
See application file for complete search history.

(56) References Cited

U.S. PATENT DOCUMENTS

2008/0199038 A1* 8/2008 Holmes ............... H04M 1/0266
381/388
2010/0177479 A1* 7/2010 Itazawa .............. H05K 7/20963
361/694
2016/0356414 A1* 12/2016 Noh ....................... H04N 5/655

* cited by examiner

US 10,750,262 B2

DISPLAY DEVICE

BACKGROUND OF THE INVENTION

1. Field of the Invention

The invention relates to a display device and, more particularly, to a display device capable of enhancing sound effect for a woofer effectively.

2. Description of the Prior Art

Currently, lots of display devices are equipped with a woofer for outputting bass effect. The woofer of a conventional display device is disposed in the back of a casing and the sound holes corresponding to the woofer are orientated towards a back side or a bottom side, such that the woofer outputs a bass effect towards the back side or bottom side of the display device. In general, some objects, such as wall, partition, etc. may exist in back of the display device, such that the bass effect outputted by the woofer may be easily blocked by the object in back of the display device. Consequently, the sound effect generated by the woofer is affected.

SUMMARY OF THE INVENTION

An objective of the invention is to provide a display device capable of enhancing sound effect for a woofer effectively, so as to solve the aforesaid problems.

According to an embodiment of the invention, a display device comprises a casing, a display module and a woofer. The casing comprises a back cover. A top side of the back cover has a plurality of sound holes formed thereon. A wall structure extends from an inner surface of the back cover. An opening of the wall structure communicates with the sound holes. The display module is disposed in the casing. The woofer is disposed in the casing and located between the display module and the back cover. The wall structure encloses the woofer to guide a sound outputted by the woofer to the sound holes through the opening.

As mentioned in the above, the invention forms the sound holes on the top side of the back cover of the display device and forms the wall structure on the inner surface of the back cover. After assembling the display device, the wall structure of the back cover encloses the woofer, such that the sound outputted by the woofer is guided to the sound holes through the opening of the wall structure, so as to output the sound from the top side of the back cover. In general, there may be few, even no, objects located at the top side of the display device. Accordingly, the sound outputted from the top side is beneficial to be received by a user. Therefore, the invention can enhance sound effect for the woofer effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
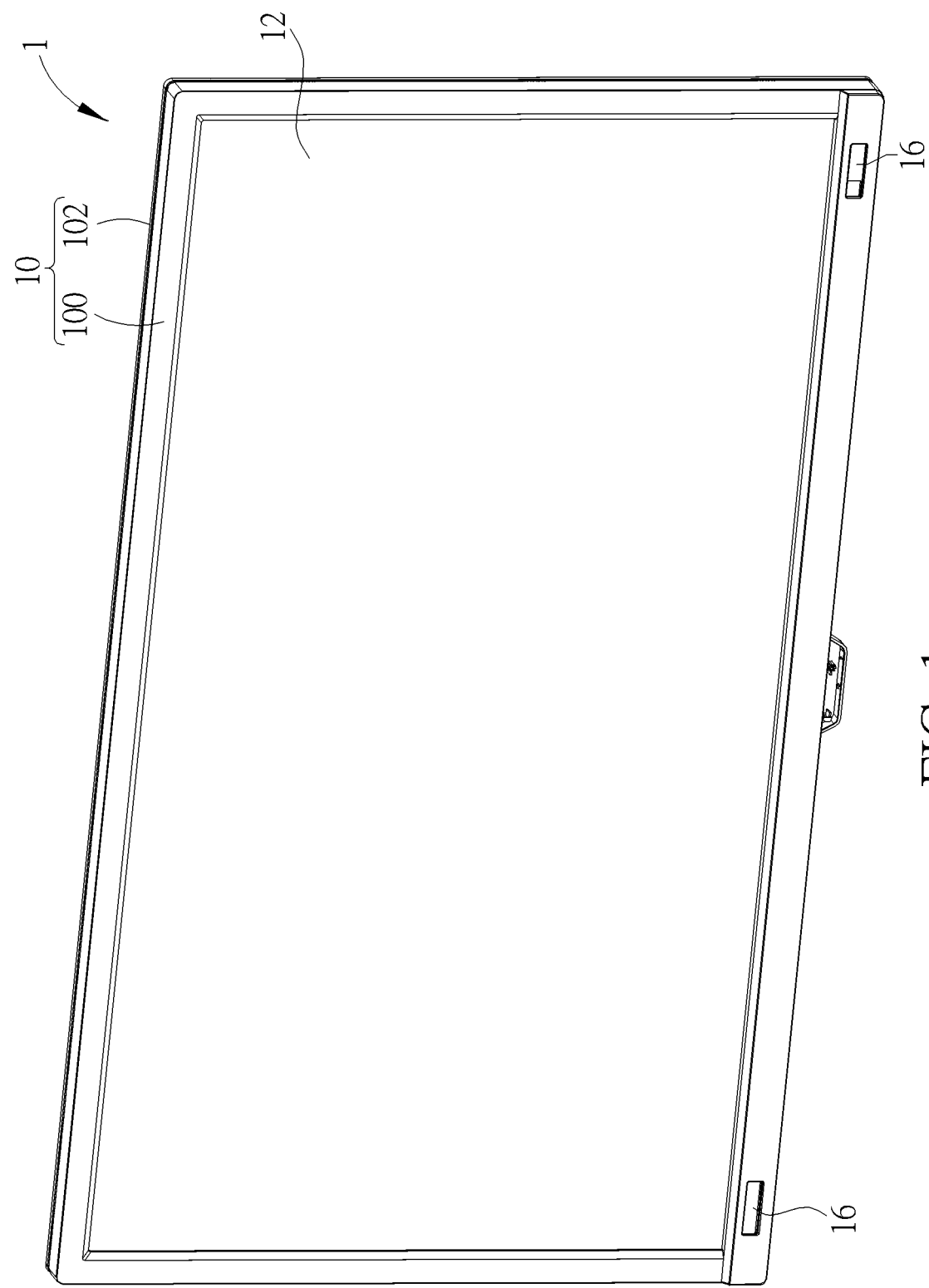
FIG. 1 is a front perspective view illustrating a display device according to an embodiment of the invention.
Figure 2:
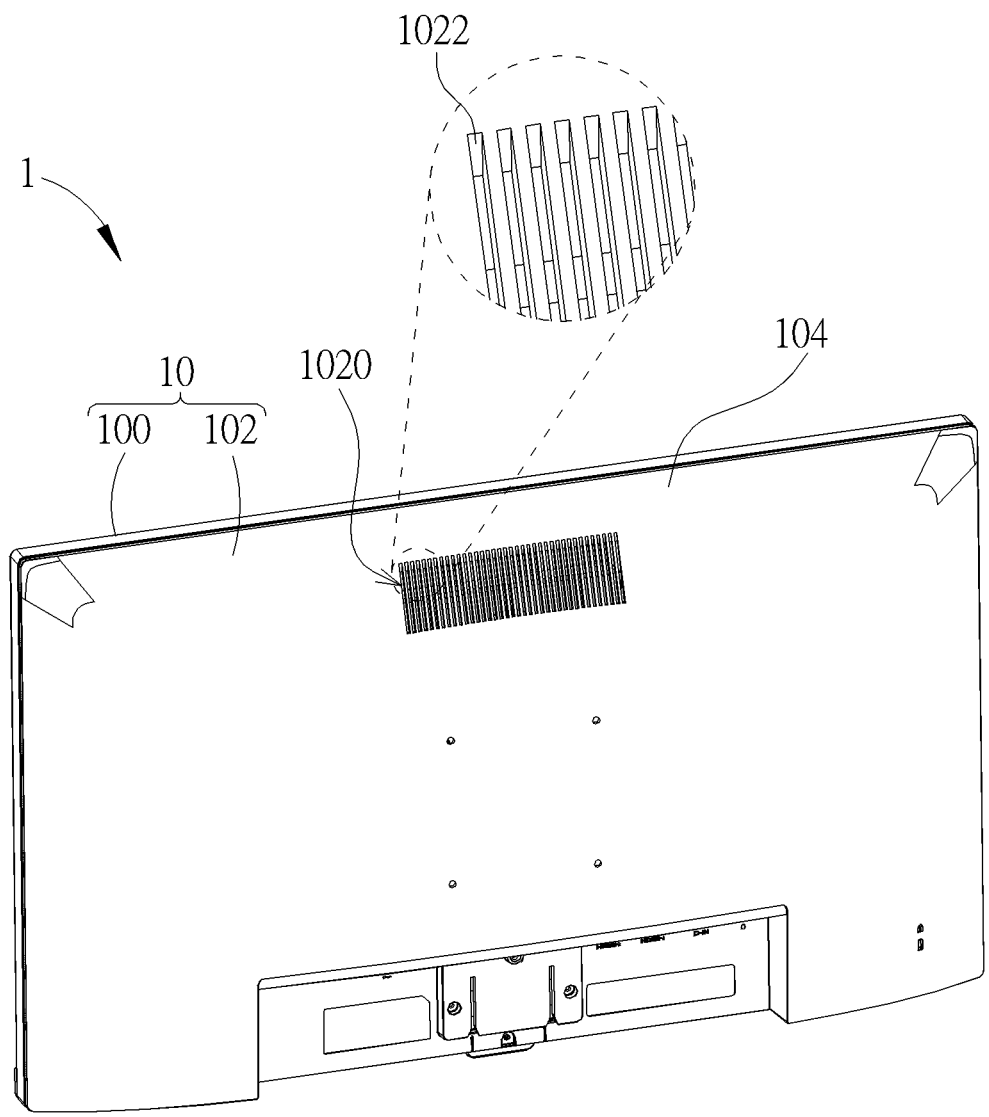
FIG. 2 is a rear perspective view illustrating the display device shown in FIG. 1.
Figure 3:
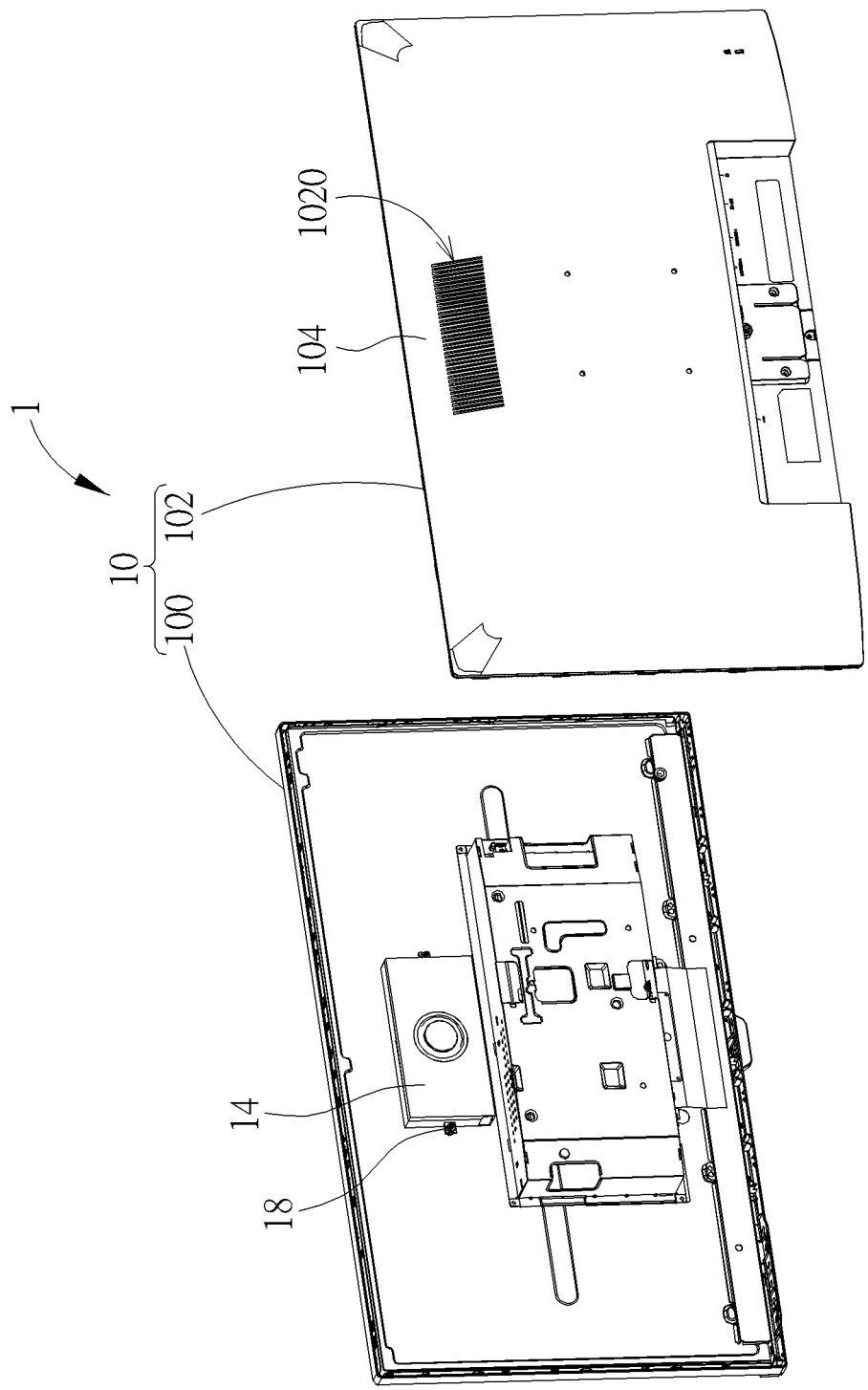
FIG. 3 is an exploded view illustrating the display device shown in FIG. 2.
Figure 4:
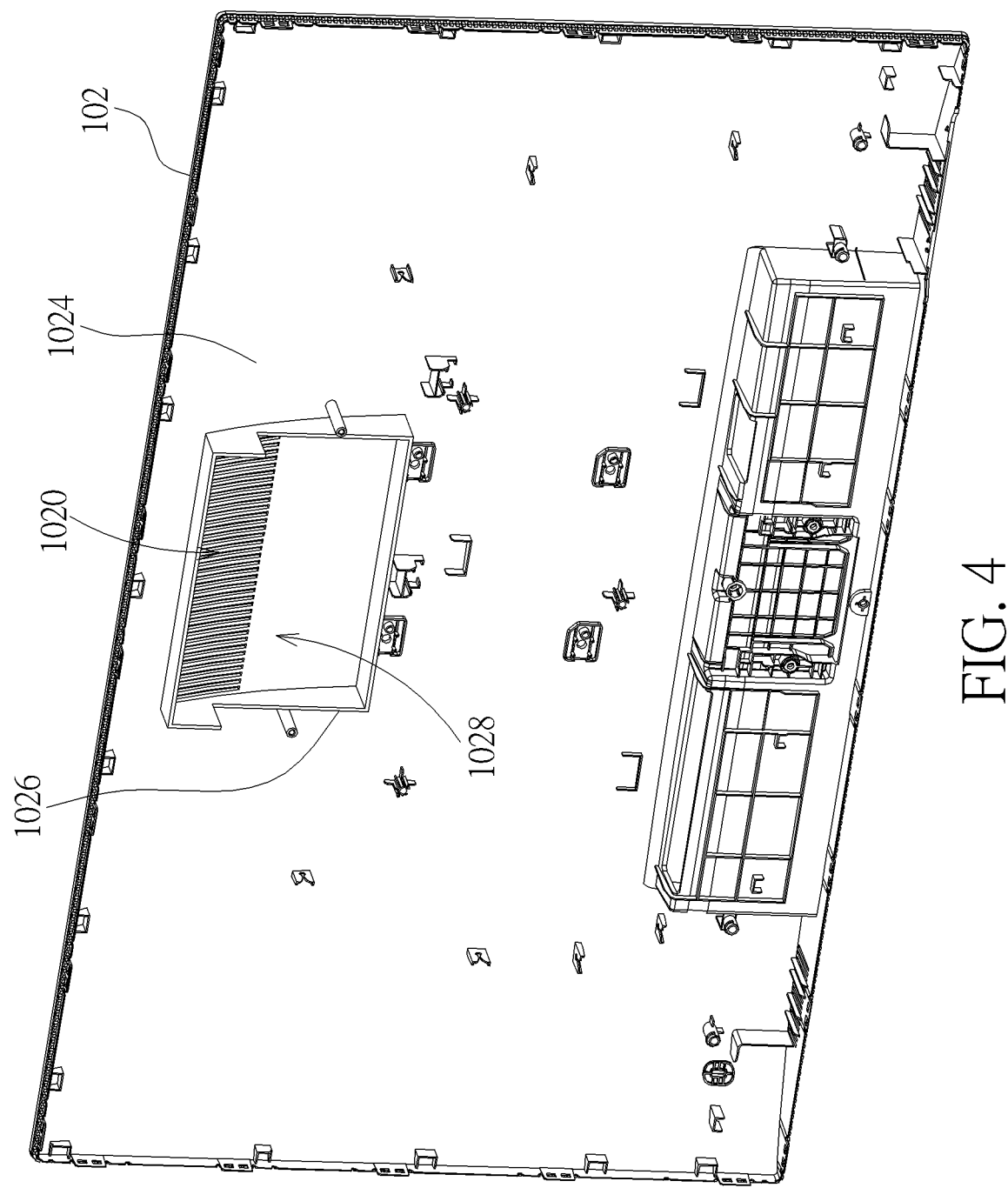
FIG. 4 is a perspective view illustrating the back cover shown in FIG. 3 from another viewing angle.
Figure 5:
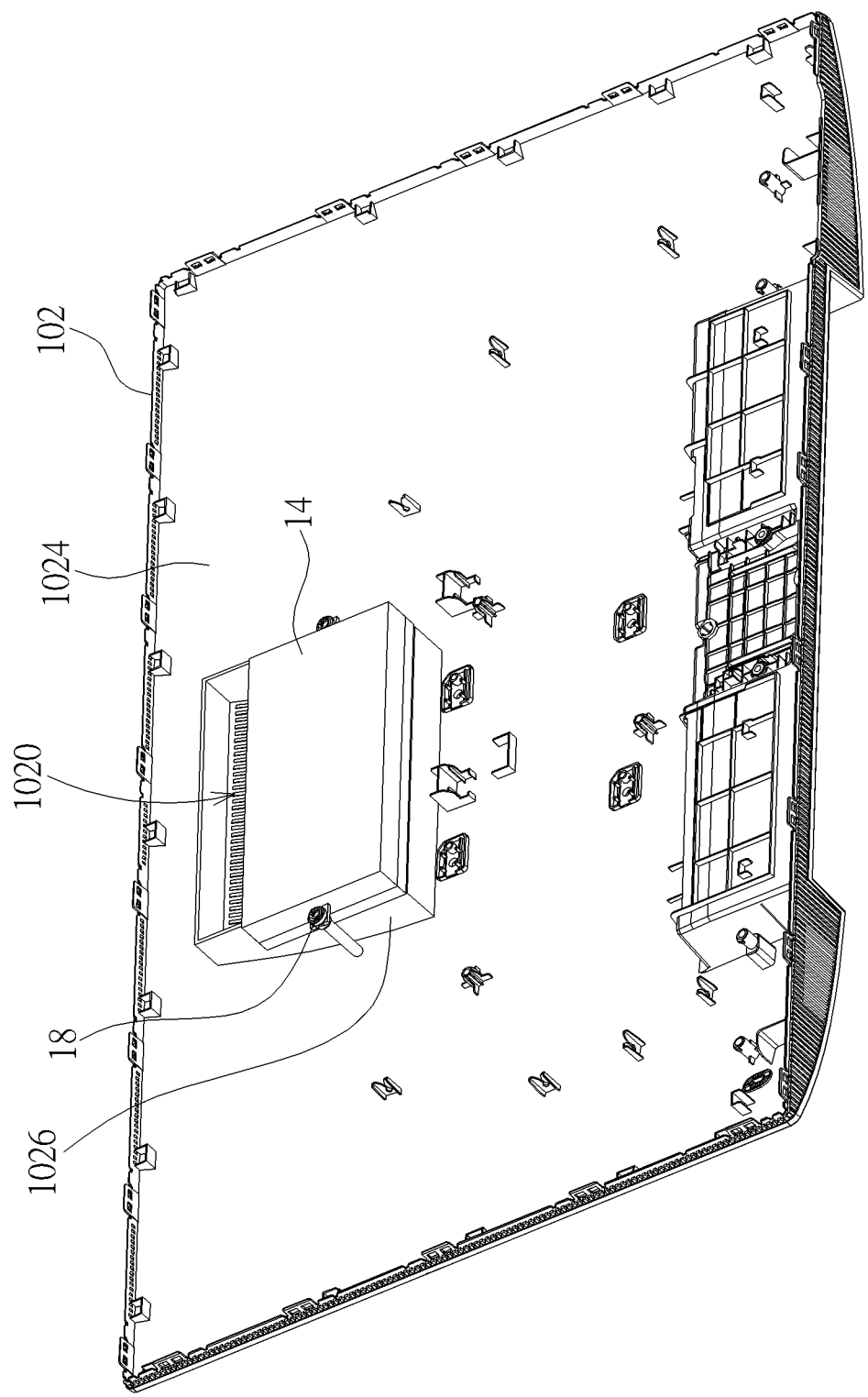
FIG. 5 is a perspective view illustrating the woofer shown in FIG. 3 being fixed to the back cover.
Figure 6:
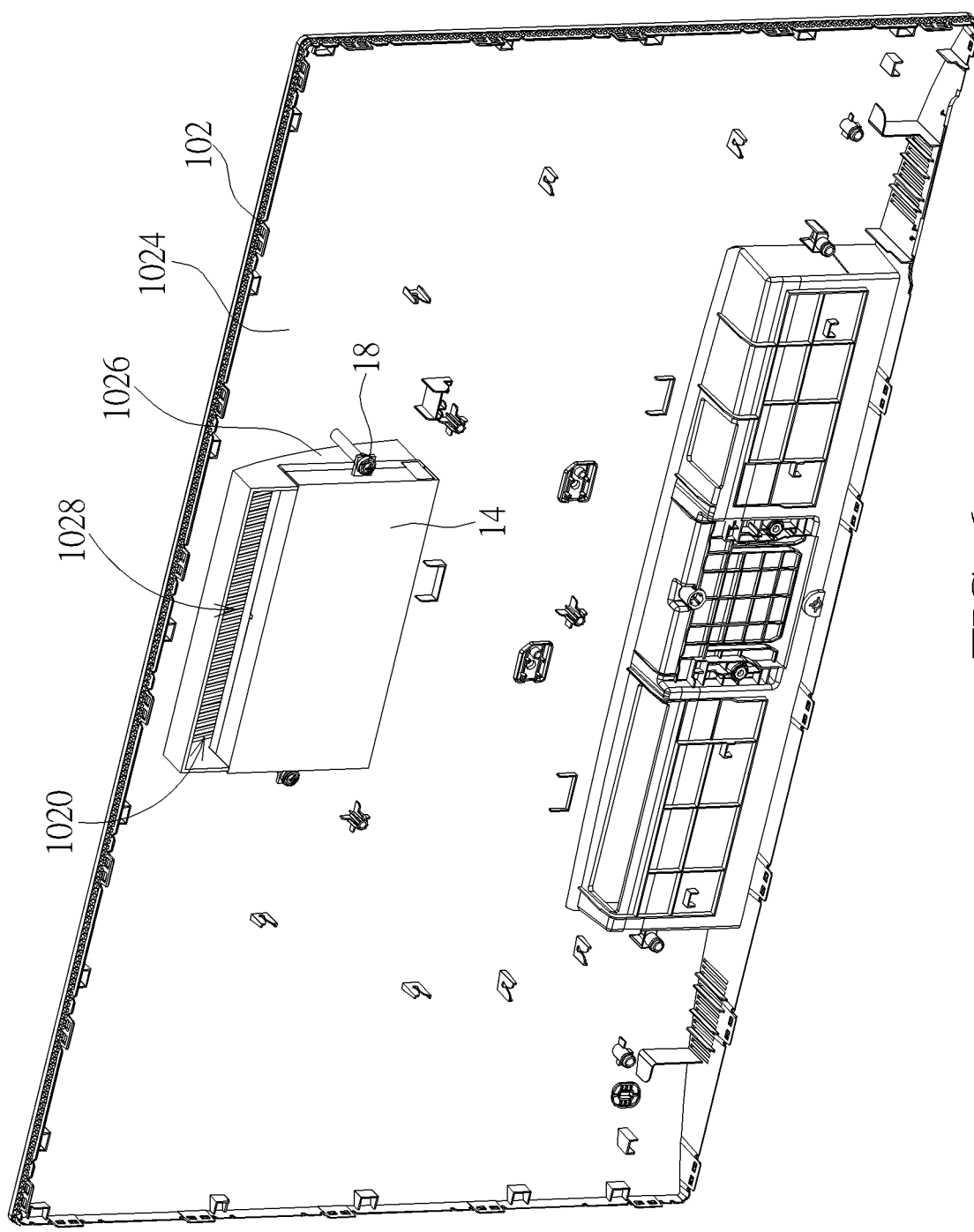
FIG. 6 is a perspective view illustrating the woofer and the back cover shown in FIG. 5 from another viewing angle.

Referring to FIGS. 1 to 6, FIG. 1 is a front perspective view illustrating a display device 1 according to an embodiment of the invention, FIG. 2 is a rear perspective view illustrating the display device 1 shown in FIG. 1, FIG. 3 is an exploded view illustrating the display device 1 shown in FIG. 2, FIG. 4 is a perspective view illustrating the back cover 102 shown in FIG. 3 from another viewing angle, FIG. 5 is a perspective view illustrating the woofer 14 shown in FIG. 3 being fixed to the back cover 102, and FIG. 6 is a perspective view illustrating the woofer 14 and the back cover 102 shown in FIG. 5 from another viewing angle.

As shown in FIGS. 1 to 3, the display device 1 comprises a casing 10, a display module 12, a woofer 14 and a plurality of speakers 16. In practical applications, the display device 1 may be a television, a computer screen, an electronic signage or other electronic devices with display function, and the display module 12 may be a liquid crystal display panel, a plasma display panel, an organic light emitting diode display panel or other display panels.

In this embodiment, the casing 10 may comprise a front bezel 100 and a back cover 102, wherein the front bezel 100 is connected to the back cover 102. The display module 12 is disposed in the casing 10 and fixed to the front bezel 100. The woofer 14 is disposed in the casing 10 and located between the display module 12 and the back cover 102. In this embodiment, the woofer 14 may be fixed to the back cover 102 by fixing members 18 (e.g. screws), as shown in FIGS. 5 and 6. The speakers 16 are disposed on the front bezel 100. In this embodiment, the display device 1 may comprise two speakers 16 disposed on lower opposite sides of the front bezel 100, as shown in FIG. 1. Accordingly, the woofer 14 may cooperate with the two speakers 16 to form 2.1-channel.

It should be noted that the number and position of the speakers 16 may be determined according to practical applications, so the invention is not limited to the embodiment shown in the figures. For example, the invention may also dispose three, five or seven speakers 16 on the front bezel 100 to cooperate with the woofer 14 to form 3.1-channel, 5.1-channel or 7.1-channel.

As shown in FIG. 2, a top side 104 of the back cover 102 has a plurality of sound holes 1020 formed thereon, wherein the top side 104 of the back cover 102 represents an upper side of the back cover 102 orientated towards the sky. In this embodiment, each of the sound holes 1020 has an inclined surface 1022 and the inclined surface 1022 inclines to the top side 104 of the back cover 102. Furthermore, as shown in FIG. 4, a wall structure 1026 extends from an inner surface 1024 of the back cover 102 and an opening 1028 of the wall structure 1026 communicates with the sound holes 1020.

As shown in FIGS. 5 and 6, after the woofer 14 is fixed to the back cover 102, the wall structure 1026 encloses the woofer 14. Accordingly, when the woofer 14 outputs a sound, the wall structure 14 guides the sound outputted by the woofer 14 to the sound holes 1020 through the opening 1028, so as to output the sound from the top side 104 of the back cover 102. In general, there may be few, even no, objects located at the top side 104 of the display device 1. Accordingly, the sound outputted from the top side 104 is beneficial to be received by a user. Therefore, the invention can enhance sound effect for the woofer 14 effectively. Furthermore, since each of the sound holes 1020 has the inclined surface 1022 inclining to the top side 104 of the back cover 102, the sound outputted by the woofer 14 can be guided to the top side 104 through the inclined surface 1022 of the sound hole 1020, so as to further enhance sound effect for the woofer 14. It should be noted that the display device 1 may further comprise a sealing material disposed between the wall structure 1026 and the woofer 14. For example, the invention may dispose a sealing sponge or other sealing materials between the wall structure 1026 and the woofer 14, so as to ensure that a closed space is formed between the woofer 14 and the sound holes 1020.

Figure 7:
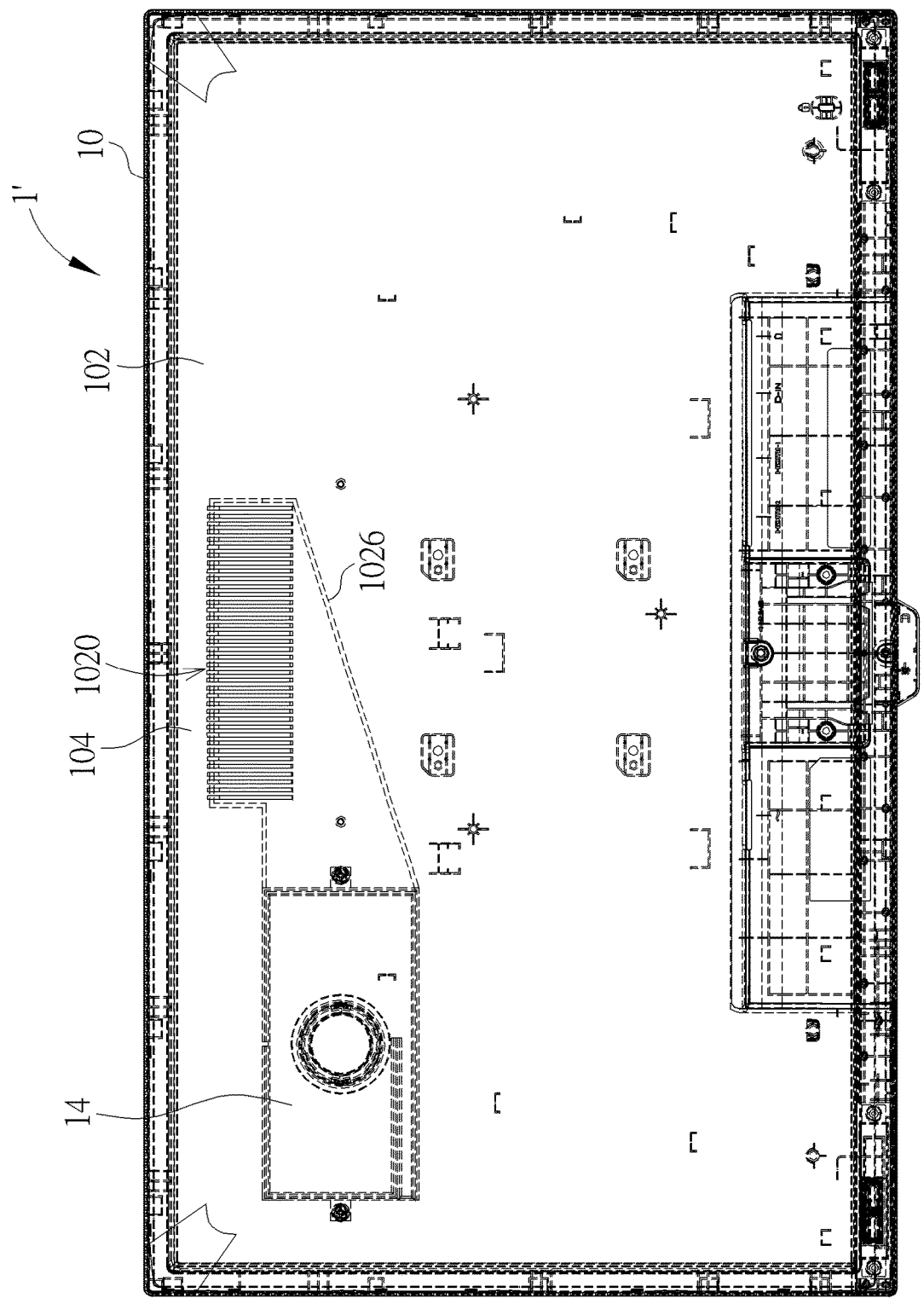
FIG. 7 is a rear view illustrating a display device according to another embodiment of the invention.
Figure 8:
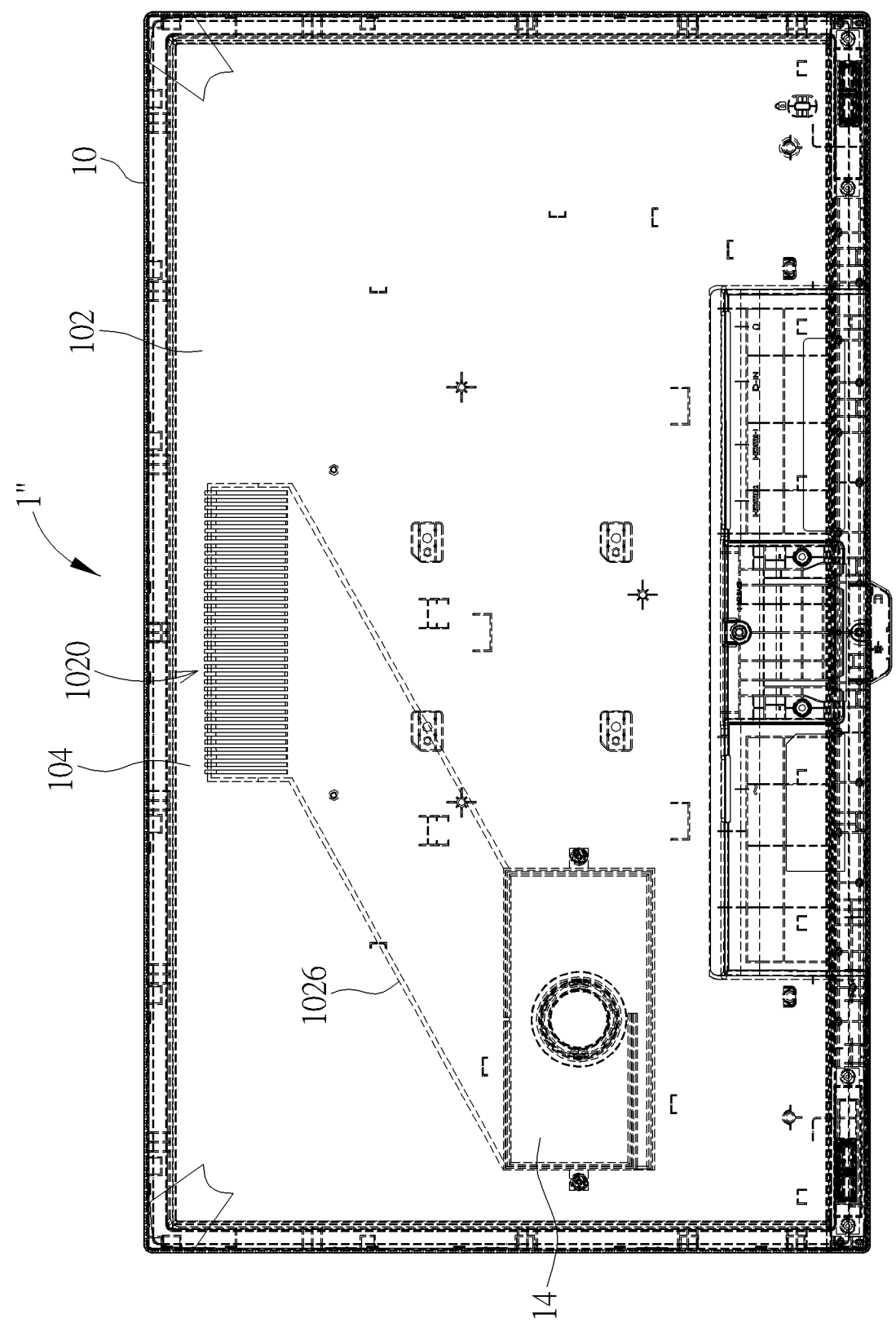
FIG. 8 is a rear view illustrating a display device according to another embodiment of the invention.

Referring to FIGS. 7 and 8, FIG. 7 is a rear view illustrating a display device 1' according to another embodiment of the invention and FIG. 8 is a rear view illustrating a display device 1' according to another embodiment of the invention. As shown in FIGS. 7 and 8, the invention may dispose the woofer 14 at any position in the casing 10 and the wall structure 1026 of the back cover 102 may extend from the sound holes 1020 to the woofer 14, so as to guide the sound outputted by the woofer 14 to the sound holes 1020 by the wall structure 1026.

As mentioned in the above, the invention forms the sound holes on the top side of the back cover of the display device and forms the wall structure on the inner surface of the back cover. After assembling the display device, the wall structure of the back cover encloses the woofer, such that the sound outputted by the woofer is guided to the sound holes through the opening of the wall structure, so as to output the sound from the top side of the back cover. In general, there may be few, even no, objects located at the top side of the display device. Accordingly, the sound outputted from the top side is beneficial to be received by a user. Therefore, the invention can enhance sound effect for the woofer effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device comprising:
    a casing comprising a back cover, a top side of the back cover having a plurality of sound holes formed thereon, a wall structure extending from an inner surface of the back cover, an opening of the wall structure communicating with the sound holes;
    a display module disposed in the casing; and
    a woofer disposed in the casing and located between the display module and the back cover, the wall structure enclosing the woofer to guide a sound outputted by the woofer to the sound holes through the opening.

2. The display device of claim 1, wherein each of the sound holes has an inclined surface and the inclined surface inclines to the top side of the back cover.

3. The display device of claim 1, further comprising a plurality of speakers, the casing further comprising a front bezel, the front bezel being connected to the back cover, the display module being fixed to the front bezel, and the speakers being disposed on the front bezel.

4. The display device of claim 1, wherein the wall structure of the back cover extends from the sound holes to the woofer.

5. The display device of claim 1, further comprising a sealing material disposed between the wall structure and the woofer.

* * * * *